United States Patent [19]
Chen et al.

[11] Patent Number: 5,933,744
[45] Date of Patent: Aug. 3, 1999

[54] ALIGNMENT METHOD FOR USED IN CHEMICAL MECHANICAL POLISHING PROCESS

[75] Inventors: Jeng-Horng Chen, Taipei; Tsu Shih, Hsinchu; Jui-Yu Chang, Tao-Yuang; Chung-Long Chang, Dou-Liu, all of Taiwan

[73] Assignee: Taiwan Semiconductor Manufacturing Co., Ltd., Hsinchu, Taiwan

[21] Appl. No.: 09/054,302

[22] Filed: Apr. 2, 1998

[51] Int. Cl.⁶ .......................... H01L 21/465; H01L 21/76
[52] U.S. Cl. .......................... 438/401; 438/622; 438/692; 438/975
[58] Field of Search .................................. 438/622, 626, 438/625, 633, 634, 692, 699, 975, 401; 148/DIG. 102

[56] References Cited

U.S. PATENT DOCUMENTS

| | | | |
|---|---|---|---|
| 4,948,755 | 8/1990 | Mo | 438/625 |
| 5,128,283 | 7/1992 | Tanaka | 438/975 |
| 5,234,868 | 8/1993 | Cote | 438/16 |
| 5,262,353 | 11/1993 | Sun et al. | 438/400 |
| 5,270,255 | 12/1993 | Wong | 148/DIG. 102 |
| 5,272,117 | 12/1993 | Roth et al. | 438/14 |
| 5,456,756 | 10/1995 | Ramaswami et al. | 118/751 |
| 5,565,703 | 10/1996 | Chang | 257/530 |
| 5,612,254 | 3/1997 | Mu et al. | 438/634 |
| 5,738,961 | 4/1998 | Chen | 148/DIG. 102 |

Primary Examiner—Peter Toby Brown
Assistant Examiner—Maria Guerrero
Attorney, Agent, or Firm—Christensen O'Connor Johnson & Kindness PLLC

[57] ABSTRACT

A method of alignment for a chemical mechanical polishing includes previously patterning a primary zero alignment mark on a surface of a wafer. A first dielectric layer is deposited on the wafer for isolation. Then, an etching is used to etch the first dielectric layer using a photoresist as a mask. First conductive plugs are formed in the first dielectric layer. Next, a first conductive layer is formed on the surface of the first dielectric layer and on the tungsten plugs. Thus, the first non-zero alignment mark pattern is formed on the surface of the first conductive layer and aligned to the first conductive plugs. Next, a second non-zero alignment mark pattern is thus formed on the surface of a second conductive layer and aligned to the a second conductive plugs. By repeating the aforementioned method, odd non-zero alignment mark patterns will be formed over the first non-zero alignment mark pattern, and even non-zero alignment mark patterns will be formed over the second non-zero alignment mark pattern. Therefore, the present invention save space to put non-zero alignment marks in multilevel interconnection and planarization processes.

20 Claims, 2 Drawing Sheets

ALIGNMENT METHOD FOR USED IN CHEMICAL MECHANICAL POLISHING PROCESS

FIELD OF THE INVENTION

The present invention relates to a method of alignment for semiconductor processes, and especially to an improved alignment method for non-zero alignment marks in chemical mechanical polishing process.

BACKGROUND OF THE INVENTION

It has been a trend to increase the packing density of a wafer. In order to achieve this, the dimension of devices must be scaled down to submicron range. Thus, the large integration of semiconductor integrated circuits (ICs) has been obtained by reduction in individual device size. Modern ICs interconnect literally millions of devices to perform a certain function. Due to improvements in the fabrication of ICs, two or more layers of interconnections between circuit elements are now used, and the number of active devices required to perform a given function has decreased. For example, some of the early DRAM memory cells required six transistors, whereas now one transistor and one capacitor suffice.

Typically, multilevel interconnections are formed in a chip in IC fabrication. In the formation of the ICs, it is critical to align a subsequent layer to a previous underlying layer. Alignment is the key way to make sure that a layer is aligned with an underlying layer. Alignment accuracy is considered how accurately the patterns of one level match their corresponding patterns on other levels. For contact etching, photoresist patterning or wafer deposition, there are several alignment marks per wafer. If one of the layers is misaligned, then a serious problem will arise in the chip. The accuracy of alignment process is a major factor that determines the yield of ICs. To achieve the necessary alignment precision, alignment marks are used. The alignment marks are typically incorporated into the chip or put in or on the edge of the wafer. The alignment mark is typically formed by etching a depth into a semiconductor wafer. The etching causes a pattern with step height in the wafer to act the alignment mark. One of the typical alignment marks is formed at the scribe lines of the wafer.

The alignment of one layer to the next is typically accomplished using a tool called wafer stepper. As is well known in the prior art, the wafer that has alignment marks formed therein is coated with a transparent photosensitive material, such as photoresist. The wafer is then loaded into the stepper. The stepper uses a laser beam with a fixed wavelength to sense the position of the alignment marks on the wafer by using the alignment marks as a reference point. The alignment mark is employed to adjust the position of the wafer to precisely align to the previous layer on the wafer. The interference from the alignment marks is reflected back to detecting devices in the stepper. The interference is also utilized as a signal to measure the exact position of the alignment marks.

The alignment mark pattern is typically patterned in the alignment area or scribe lines of the wafer. Subsequent layers used to form the integrated circuit are formed over the wafer. Subsequent layers will cover the original alignment mark pattern. The alignment mark is replicated in the subsequently formed layers. As more layers are added to the IC, the alignment mark pattern is propagated upward with subsequent layers. In some fabrication processes, a polishing process is needed to remove a portion of the inter-level dielectric (ILD) layer for achieving a better topography.

However, a problem associated with building up the alignment mark pattern is that it is incompatible with planarization process. It is necessary to planarize the topography of the IC for subsequently formed layer, such as metal layer. Thus, the replicated alignment mark in the interlevel dielectric layer is removed by the chemical mechanical polishing process. If a metal layer or a polysilicon layer is then formed on the ILD layer. Unfortunately, the replicated alignment mark in these layers is invisible, because the metal layer is opaque to the laser beam. Thus, it is impossible to align the metal pattern to contact pattern without the alignment mark pattern or a replicated alignment mark, it is impossible to align the metal pattern to contact pattern.

Prior art proposed non-zero alignment marks that are used in the back end of chemical mechanical polishing (CMP) process. However, the non-zero alignment mark must be created on each layer or only each oxide layer. Each alignment mark occupies one space on the wafer. Thus, it needs much space in the scribe lines or blank area for forming the non-zero alignment marks due to the ICs includes several metal layers. What is required is a method of alignment that can be used for chemical mechanical polishing.

SUMMARY OF THE INVENTION

The present invention can replicate a plurality of alignment mark patterns for CMP process to achieve the space-saving feature. Odd non-zero alignment mark patterns will be formed over a first non-zero alignment mark pattern, whereas even non-zero alignment mark patterns will be formed over a second non-zero alignment mark pattern. The first non-zero alignment mark pattern is not necessary to be sited adjacent to the second non-zero alignment mark pattern.

A set of primary zero alignment marks is previously formed on a surface of a wafer. A first dielectric layer is deposited on the wafer for isolation. Then, an etching is used to etch the first dielectric layer using a photoresist as a mask, thereby generating a pattern in the first dielectric layer. The pattern has a step height that can be used for alignment. First conductive plugs are formed in the major portion of the holes of the pattern. Next, a first conductive layer is formed on the surface of the first dielectric layer and on the tungsten plugs. Thus, the first non-zero alignment mark pattern 106 is formed on the surface of the first conductive layer and aligned to the first conductive plugs. A chemical mechanical polishing (CMP) can be performed on the surface of the first conductive layer. Next, a second dielectric layer is then deposited on the first conductive layer. Then, a second interconnection consisting of second conductive (tungsten) plugs and a second conductive layer are formed on the second dielectric layer. Similarly, the second non-zero alignment mark pattern is thus formed on the surface of the second conductive layer and aligned to the second conductive plugs. By repeating the aforementioned method, odd non-zero alignment mark patterns will be formed over the first non-zero alignment mark pattern, and even non-zero alignment mark patterns will be formed over the second non-zero alignment mark pattern.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a novel alignment method used in semiconductor process. The present invention is most useful for those processes associated with the multi-level interconnection and planarization. Moreover, the present invention uses least space for non-zero alignment marks in the scribe lines when the scribe lines are full of test key. If the non-zero alignment marks are located in the blank area, it can enhance wafer utilization. The more detailed description of the present invention will be seen as follows.

Figure 1:
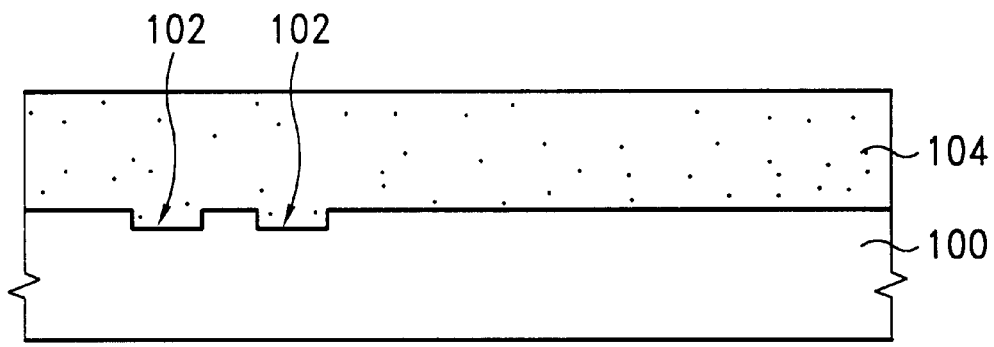
FIG. 1 is a cross section view of a semiconductor wafer illustrating the step of forming a primary alignment mark and forming a first dielectric layer in accordance with the present invention.

Referring to FIG. 1, a wafer 100 is provided for forming integrated circuits. The integrated circuits are formed in the IC area (not shown) of the wafer 100. An alignment mark pattern 102 is formed in the alignment area or scribe line of the wafer for alignment. The alignment mark pattern 102 is indicated by a primary zero alignment mark. Further, device and isolation regions (both are not shown) are respectively formed in the IC area of the wafer. The formation of the device is well known in the art, thus it will not be described in detail and not shown in related drawings herein. Well-known semiconductor processes, such as ion implantation, spacer formation, are not described in order to not unnecessarily obscure the present invention.

Figure 2:
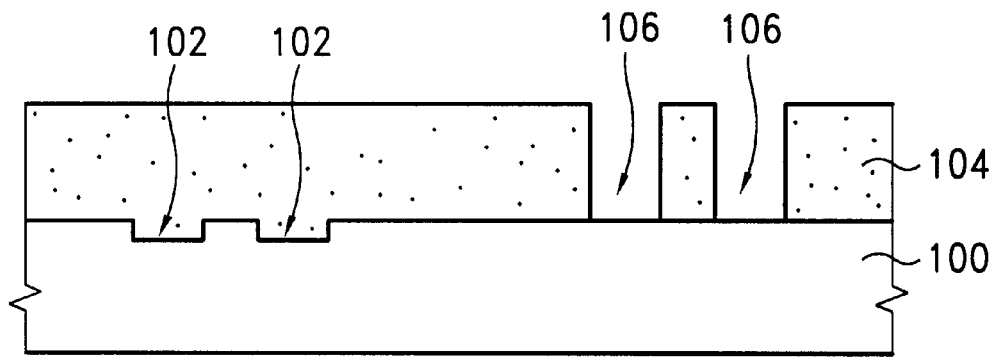
FIG. 2 is a cross section view of a semiconductor wafer illustrating the step of forming a first nonzero alignment mark pattern in accordance with the present invention.

A first dielectric layer 104, such as an oxide layer is deposited on the wafer 100 for isolation. The top of the align mark pattern (zero alignment mark )102 is also coated with the first dielectric layer 104. Then, a first non-zero alignment mark pattern 106 is formed in the first dielectric layer 104 using the zero alignment mark 102 as a reference for a stepper, as shown in FIG. 2. In order to distinguish from the original alignment mark pattern 102, the alignment mark pattern in the dielectric layer is indicated by "non-zero" alignment mark pattern. The first non-zero alignment mark pattern 106 cannot be overlap with the alignment mark pattern 102. Preferably, the first non-zero alignment pattern 106 shifted a space from the alignment mark pattern 102. Further, the first non-zero alignment mark pattern 106 is formed by lithography technologies. In order to achieve this, a photoresist is patterned on the first dielectric layer 104. Then, an etching is used to etch the first dielectric layer 104 using the photoresist as a mask, thereby generating a pattern in the first dielectric layer 104. The pattern has a step height that can be used for alignment. The pattern may be a plurality of holes, trenches or the like. Further, the configuration of the pattern can be any suitable configuration.

Figure 3:
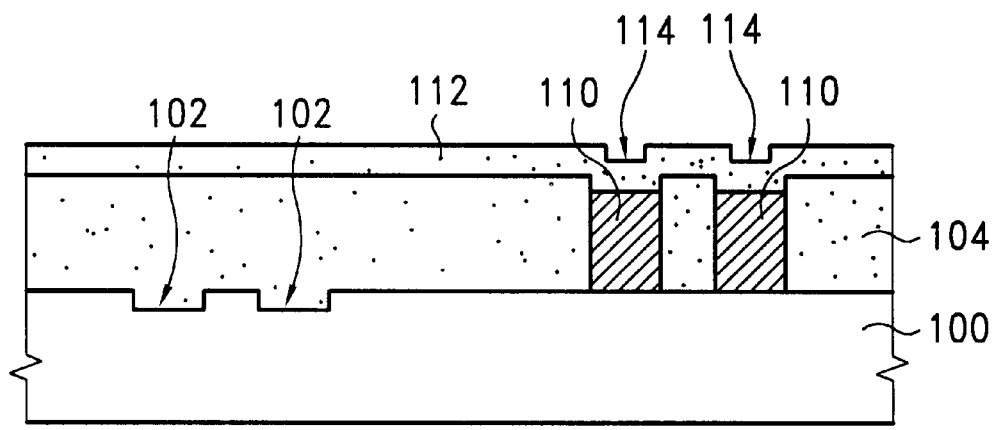
FIG. 3 is a cross section view of a semiconductor wafer illustrating the step of forming a replicated first non-zero alignment mark pattern in accordance with the present invention.

Turning to FIG. 3, first conductive plugs, such as first tungsten plugs 110, are formed in the major portion of the holes of the pattern 106 and kept a distance from the surface of the first dielectric layer 104. Next, a first conductive layer 112 is formed on the surface of the first dielectric layer 104 and on the tungsten plugs 110. The first conductive layer 112 has recess portions 114 over the tungsten plugs 110 due to the tungsten plugs only fill into a portion of the holes. Thus, the first non-zero alignment mark pattern 106 is replicated on the surface of the first conductive layer 112 and aligned to the first conductive plugs 110 in the holes. The first conductive layer 112 can be any suitable metal, alloy or the like. Preferably, it is formed of AlCu. A chemical mechanical polishing (CMP) can be performed on the surface of the first conductive layer 112 for planarization if necessary. The surface over the zero alignment mark 102 is flat. The first conductive plugs and the first conductive layer 112 are not only act as electrical interconnection, but serve as an alignment mark pattern.

Figure 4:
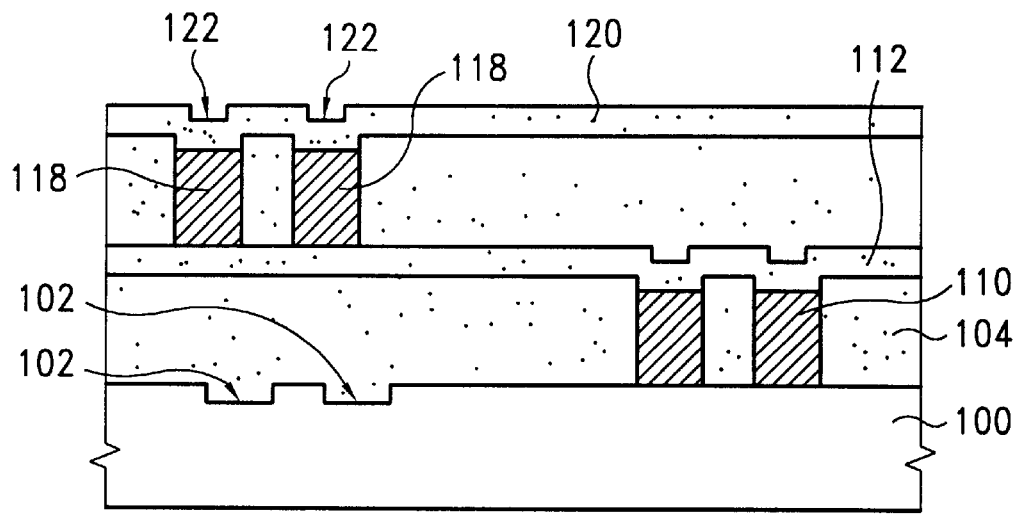
FIG. 4 is a cross section view of a semiconductor wafer illustrating the step of forming a second non-zero alignment mark pattern in accordance with the present invention.

Next, referring to FIG. 4, a second dielectric layer 116 is then deposited on the first conductive layer 112. Then, a second interconnection consisting of a second conductive (tungsten) plugs 118 and a second conductive layer 120 is formed on the second dielectric layer 116 by using aforesaid method. In these steps, the first non-zero alignment mark 106 pattern is used as a reference for alignment. The second conductive plugs 118 are also formed in a major portion of holes in the second dielectric layer 116. Similarly, the second non-zero alignment mark pattern 122 is thus formed on the surface of the second conductive layer 120 and aligned to the second conductive plugs. The second non-zero alignment mark pattern 122 is preferably formed adjacent to the first non-zero alignment mark pattern 106. Further, the second non-zero alignment mark pattern 122 can be formed over the zero alignment mark 102 or not. The second conductive layer 120 can be metal or alloy, and preferably formed of AlCu. The second conductive layer 120 is flattened by CMP for planarization if desired.

Figure 5:
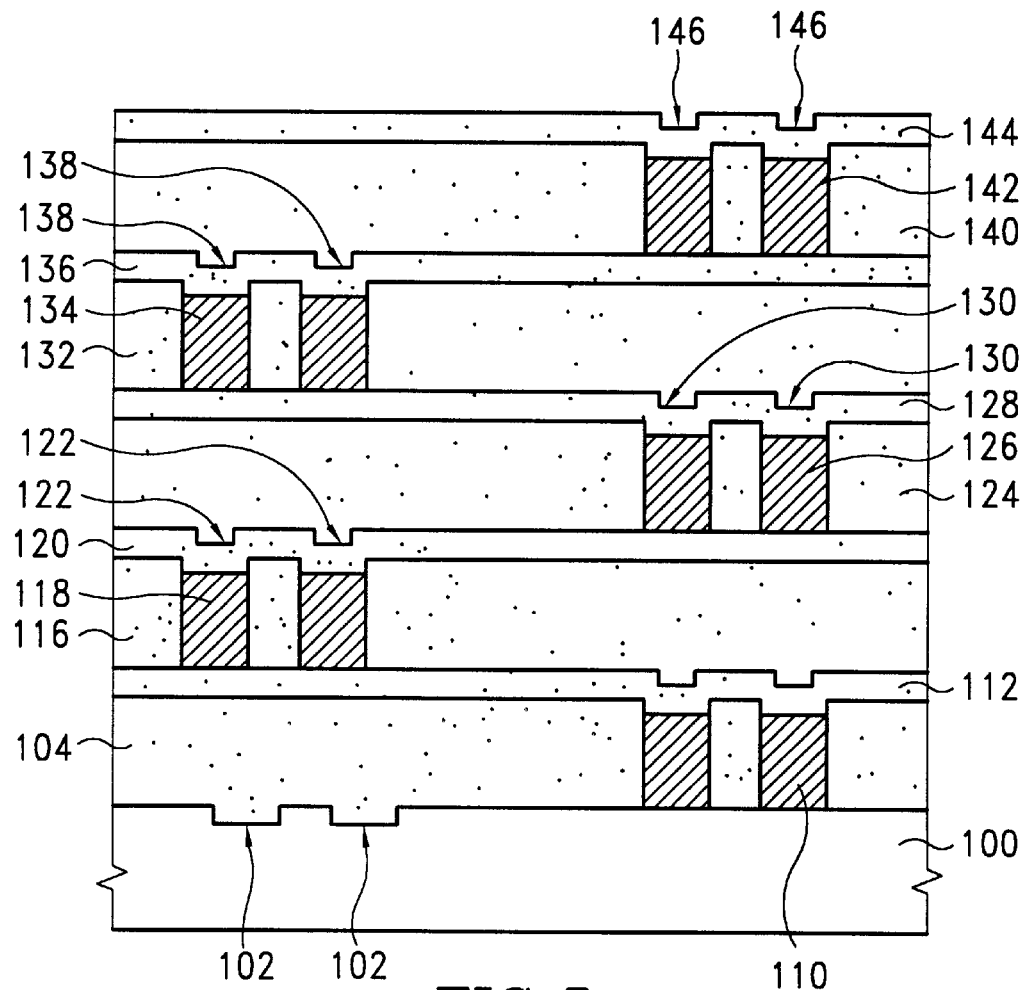
FIG. 5 is a cross section view of a semiconductor wafer illustrating the steps of forming third, forth and fifth non-zero alignment mark patterns in accordance with the present invention.

By using the aforementioned method, a third interconnection is formed on a third dielectric layer 124 that is formed on the second conductive layer 120. FIG. 5 shows the scheme in accordance with the steps. Similarly, the third interconnection is consists of third tungsten plugs 126 and a third conductive layer 128. Therefore, a third non-zero alignment mark pattern 130 is aligned to the third tungsten plugs 126. It has to be noted that the third non-zero alignment mark pattern 130 is preferably stacked over the first non-zero alignment mark pattern 106 site for space-saving feature. A fourth non- zero alignment mark pattern 138 is formed aligned to the second non-zero alignment mark pattern 122 for saving the space by repeating the processes. Of course, a fourth dielectric layer 132 is formed on the third conductive layer 128, and fourth tungsten plugs 134 is formed therein. Further, a forth conductive layer 136 is formed on the fourth tungsten plugs 134.

The present invention can replicate a plurality of alignment mark patterns for multi-level interconnection and CMP process. The odd non-zero alignment mark pattern will be formed over the first non-zero alignment mark pattern 106, whereas the even nonzero alignment mark pattern will be sited over the second non-zero alignment mark pattern 122. For example, the fifth non-zero alignment mark pattern 146 is sited over the first non-zero alignment mark pattern 106. Certainly, before the fifth non-zero alignment mark pattern 106 is formed, the present invention includes forming a fifth dielectric layer 140, a fifth conductive plugs 142 and a fifth conductive layer 144, respectively.

As is understood by a person skilled in the art, the foregoing preferred embodiment of the present invention is illustrative of the present invention rather than limiting of the present invention. For example, the spirit of the present invention covers odd or even alignment mark patterns those are stacked for saving space. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What claim is claim:

1. A method of alignment for chemical mechanical polishing process, an alignment mark pattern is previously formed on a surface of a semiconductor substrate, said method comprising:

forming a first interconnection having first recess portion over said substrate by using said alignment mark pattern as a first reference for alignment, said first recess portion being used as a first non-zero alignment mark pattern;

forming a first dielectric layer on said first interconnection; and forming a second interconnection having a second recess portion over said first dielectric layer by using said first non-zero alignment mark pattern as a second reference for alignment, wherein said second recess portion is shifted from said first recess portion, said second recess portion being used as a second non-zero alignment mark pattern.

2. The method of claim 1, further comprising:

forming a second dielectric layer on said second interconnection; and forming a third interconnection having a third recess position over said second dielectric layer by using said second non-zero alignment mark pattern as a third reference for alignment, said third recess portion being used as a third non-zero alignment mark pattern, wherein said third non-zero alignment mark pattern is over said first non-zero alignment mark pattern.

3. The method of claim 2, further comprising:

forming a third dielectric layer on said third interconnection for isolation; and forming a fourth interconnection having fourth recess portion over said third dielectric layer by using said third non-zero alignment mark pattern as a fourth reference for alignment, said fourth recess portion being used as a fourth non-zero alignment mark pattern, wherein said fourth non-zero alignment mark pattern is over said second non-zero alignment mark pattern.

4. The method of claim 3, further comprising:

forming a fourth dielectric layer on said fourth interconnection for isolation; and forming a fifth interconnection having fifth recess portions over said fourth dielectric layer by using said fourth non-zero alignment mark pattern as a fifth reference for alignment, said fifth recess portion being used as a fifth non-zero alignment mark pattern, wherein said fifth non-zero alignment mark pattern is over said third non-zero alignment mark pattern.

5. The method of claim 1, further comprising performing a first chemical mechanical polishing after forming said first interconnection.

6. The method of claim 1, further comprising performing a second chemical mechanical polishing after forming said second interconnection.

7. The method of claim 2, further comprising performing a third chemical mechanical polishing after forming said third interconnection.

8. The method of claim 3, further comprising performing a fourth chemical mechanical polishing after forming said fourth interconnection.

9. The method of claim 4, further comprising performing a fifth chemical mechanical polishing after forming said fifth interconnection.

10. A method of alignment for use with a chemical mechanical polishing process, an alignment mark pattern previously formed on a surface of a semiconductor substrate, said method comprising:

patterning a first dielectric layer having a first hole formed therein, said first hole being shifted from said alignment mark pattern;

forming a first conductive plug in a major portion of said first hole and keeping a distance from a surface of said first dielectric layer;

forming a first conductive layer on said first dielectric layer and said first conductive plug, said first conductive layer having a recess portion aligned to said first hole to act as a first non-zero alignment mark pattern, wherein said first conductive layer and said first conductive plug are used as a first interconnection;

patterning a second dielectric layer having a second hole formed therein, said second hole being adjacent to said first non-zero alignment mark pattern;

forming a second conductive plug in a major portion of said second hole; and forming a second conductive layer on said second dielectric layer and said second conductive plug, said second conductive layer having a recess portion that is aligned to said second hole to act as a second non-zero alignment mark pattern, wherein said second conductive layer and said second conductive plug are used as a second interconnection.

11. The method of claim 10, further comprising:

patterning a third dielectric layer having a third hole formed therein, said third hole being adjacent to said second non-zero alignment mark pattern and over said first non-zero alignment mark pattern;

forming a third conductive plug in a major portion of said third hole; and forming a third conductive layer on said third dielectric layer and said third conductive plug, said third conductive layer having a recess portion that is aligned to said third hole to act as a third non-zero alignment mark pattern, wherein said third conductive layer and said third conductive plug are used as a third interconnection.

12. The method of claim 11, further comprising:

patterning a fourth dielectric layer having a fourth hole formed therein, said fourth hole being adjacent to said third non-zero alignment mark pattern and over said second non-zero alignment mark pattern;

forming a fourth conductive plug in a major portion of said fourth holes; and forming a fourth conductive layer on said fourth dielectric layer and said fourth conductive plug, said fourth conductive layer having a recess portion that is aligned to said fourth hole to act as a fourth non-zero alignment mark pattern, wherein said fourth conductive layer and said fourth conductive plug are used as a fourth interconnection.

13. The method of claim 12, further comprising:

patterning a fifth dielectric layer having a fifth hole formed therein, said fifth hole being adjacent to said forth non-zero alignment mark pattern and over said third non-zero alignment mark pattern;

forming a fifth conductive plug in a major portion of said of fifth hole; and forming a fifth conductive layer on said fifth dielectric layer and said fifth conductive plug, said fifth conductive layer having a recess portion that is aligned to said fifth hole to act as a fifth non-zero alignment mark pattern, wherein said fifth conductive layer and said fifth conductive plug are used as a fifth interconnection.

14. The method of claim 10, further comprises performing a first chemical mechanical polishing after forming said first conductive layer.

15. The method of claim 10, further comprises performing a second chemical mechanical polishing after forming said second conductive layer.

16. The method of claim 11, further comprises performing a third chemical mechanical polishing after forming said third conductive layer.

17. The method of claim 12, further comprises performing a forth chemical mechanical polishing after forming said forth conductive layer.

18. The method of claim 13, further comprises performing a fifth chemical mechanical polishing after forming said fifth conductive layer.

19. A method of forming alignment marks over a substrate, the method comprising:

providing a substrate having an alignment mark formed thereon;

forming a first dielectric layer over said substrate and said alignment mark;

forming a first metal structure over said first dielectric layer using said alignment mark as an alignment reference, said first metal structure being shifted from said alignment mark, said first metal structure including a recessed portion serving as a first non-zero alignment mark;

forming a second dielectric layer over said first metal structure; and forming a second metal structure over said second dielectric layer using said first non-zero alignment mark as a second alignment reference, said second metal structure being shifted from said first non-zero alignment mark, the second metal structure including a recessed portion serving as a second non-zero alignment mark.

20. The method of claim 19 wherein said first metal structure comprises a recessed metal plug formed in said first dielectric layer and a metal layer formed over and on said recessed metal plug, wherein a chemical-mechanical polish of the metal layer to planarize the metal layer located above an active area of said substrate does not completely remove said recessed portion of said first metal structure.

\* \* \* \* \*

UNITED STATES PATENT AND TRADEMARK OFFICE
CERTIFICATE OF CORRECTION

Page 1 of 2

PATENT NO. : 5,933,744
DATED : August 3, 1999
INVENTOR(S) : J.-H. Chen et al.

It is certified that error appears in the above-identified patent and that said Letters Patent is hereby corrected as shown below:

| COLUMN | LINE | |
|---|---|---|
| [54] col. 1 | Title | "FOR USED IN" should read --FOR USE IN A-- |
| [57] Abstract | 13 | after "aligned to" delete "the a" |
| [57] Abstract | 18 | "save" should read --saves-- |
| 5 (Claim 1, line 5) | 16 | after "having" insert --a-- |
| 6 (Claim 10, line 2) | 11 | after "pattern" insert --being-- |
| 7 (Claim 13, line 7) | 7 | before "fifth" delete "of" |
| 7 (Claim 14, line 1) | 14 | "comprises" should read --comprising-- |
| 7 (Claim 15, line 1) | 17 | "comprises" should read --comprising-- |
| 7 (Claim 16, line 1) | 20 | "comprises" should read --comprising-- |

UNITED STATES PATENT AND TRADEMARK OFFICE
CERTIFICATE OF CORRECTION

PATENT NO. : 5,933,744
DATED : August 3, 1999
INVENTOR(S) : J.-H. Chen et al.

It is certified that error appears in the above-identified patent and that said Letters Patent is hereby corrected as shown below:

| COLUMN | LINE | |
|---|---|---|
| 7 (Claim 17, line 1) | 23 | "comprises" should read --comprising-- |
| 7 (Claim 17, line 2) | 24 | "forth" should read --fourth-- |
| 7 (Claim 17, line 3) | 25 | "forth" should read --fourth-- |
| 7 (Claim 18, line 1) | 26 | "comprises" should read --comprising-- |